(12) United States Patent
Moloudi (10) Patent No.: US 6,181,756 B1
(45) Date of Patent: Jan. 30, 2001

(54) PHASE LOCKED LOOP BASED ON A CHARGE PUMP

(75) Inventor: Shervin Moloudi, Los Angeles, CA (US)

(73) Assignee: Nokia Mobile Phones Ltd., Espoo (FI)

( * ) Notice: Under 35 U.S.C. 154(b), the term of this patent shall be extended for 0 days.

(21) Appl. No.: 09/468,583

(22) Filed: Dec. 21, 1999

(30) Foreign Application Priority Data

Dec. 22, 1998 (FI) .......................................................... 982780

(51) Int. Cl.⁷ .................................................................. H03D 3/24
(52) U.S. Cl. ............................ 375/374; 375/376; 327/157
(58) Field of Search ................................... 375/374, 376, 375/294, 327; 327/156, 157, 147, 148; 332/127

(56) References Cited

U.S. PATENT DOCUMENTS

| 5,532,636 | 7/1996 | Mar et al. ................................. 327/543 |
| 5,592,120 | * 1/1997 | Palmer et al. ........................... 327/536 |
| 5,736,880 | * 4/1998 | Bruccoleri et al. ..................... 327/157 |
| 5,864,249 | * 1/1999 | Shoji ........................................ 327/156 |
| 5,886,551 | * 3/1999 | Narahara ................................. 327/157 |
| 6,040,742 | * 3/2000 | Bailey et al. .............................. 331/2 |

FOREIGN PATENT DOCUMENTS

| 0642227 A1 | 3/1995 | (EP) . |
| 0798862A1 | 10/1997 | (EP) . |
| WO 93/06659 | 4/1993 | (WO) . |

* cited by examiner

*Primary Examiner*—Don N. Vo
*Assistant Examiner*—Phuong Phu
(74) *Attorney, Agent, or Firm*—Perman & Green, LLP (57) ABSTRACT

The invention relates to a method for balancing the output current ($i_{A1}$) of a first charge pump (CHP1). The first charge pump (CHP1) comprises a first charging current source (CS1) and a first discharging current source (CS2). The output current ($i_{A1}$) of the first charge pump (CHP1) is supplied by at least one said current source (CS1, CS2). The method consists of the following steps: providing a second charge pump (CHP2) with a second charging current source (CS3) and a second discharging current source (CS4), supplying the output current ($i_{A2}$) of said second charge pump (CHP2) by at least one said second current source (CS3, CS4), and supplying a reference current ($i_5$) on the basis of the output current ($i_{A2}$) supplied by said second charge pump (CHP2). The balancing is conducted by combining said reference current ($i_5$) with the output current ($i_{A1}$) supplied by the first charge pump (CHP1).

12 Claims, 5 Drawing Sheets

PHASE LOCKED LOOP BASED ON A CHARGE PUMP

The present invention relates to a method for balancing the output current of a charge pump according to the appended claim 1. Also, the invention relates to a charge pump structure according to the appended claim 5. Furthermore, the invention relates to a wireless communication device according to the appended claim 10.

Figure 1:
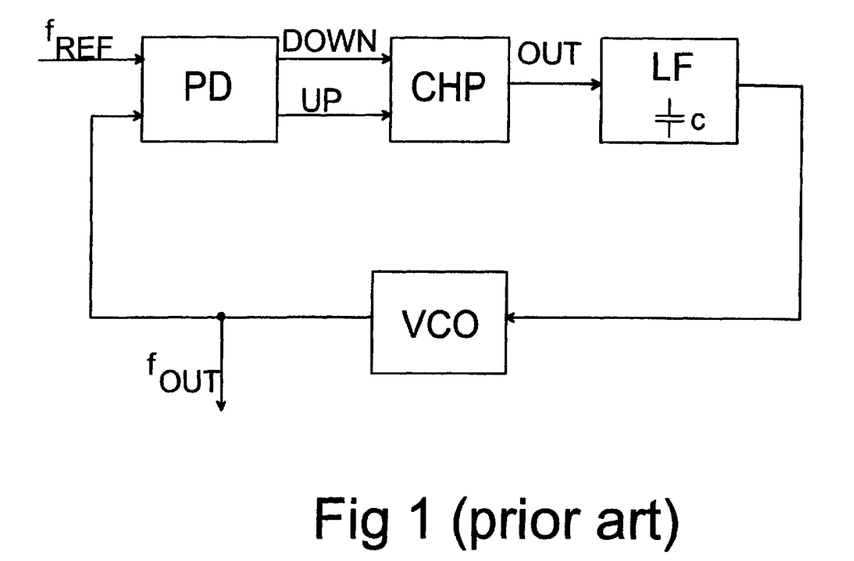
FIG. 1 shows a phase-locked loop of prior art in a reduced block chart.
Figure 2:
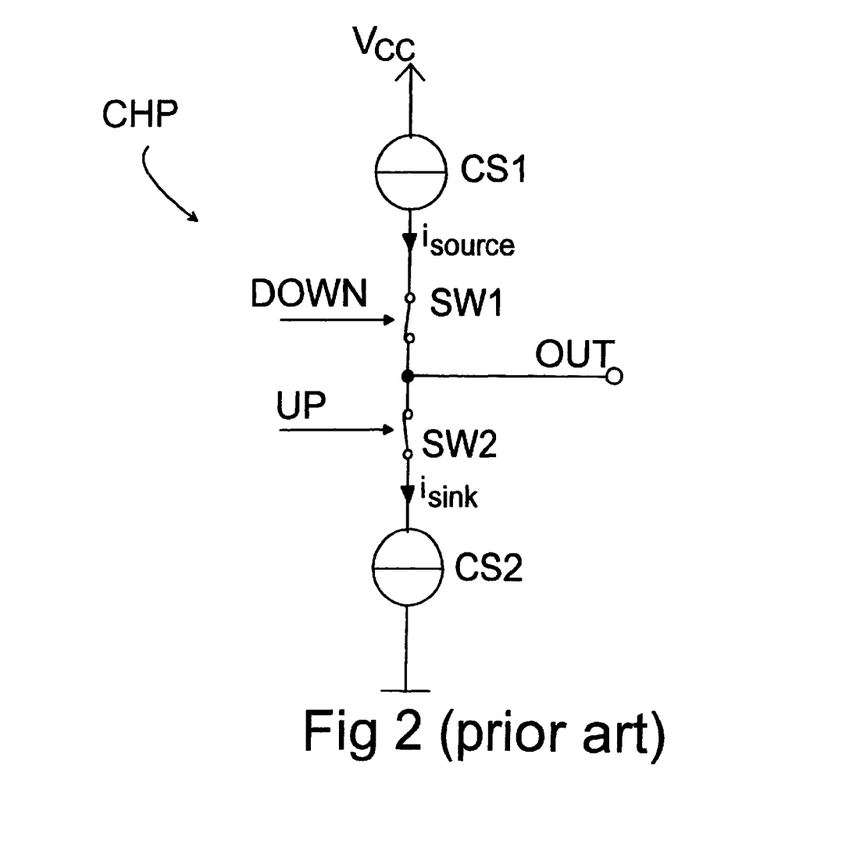
FIG. 2 shows a charge pump of prior art in a reduced block chart.

Particularly in wireless communication devices, phase-locked loops (PLL) are used as oscillators in frequency synthesis, and in the generation of clock signals. Phase-locked loops are generally implemented as integrated circuits, and the charge-pump technique is used in them. Appended FIG. 1 shows a phase-locked loop according to prior art, comprising a phase detector PD, a charge pump CHP with two current sources CS1, CS2 (FIG. 2), a loop filter LF which is typically implemented as a low pass filter, and a voltage-controlled oscillator VCO. FIG. 2 shows a charge pump CHP according to prior art. The phase detector PD receives two clock signals: a reference signal and a clock signal generated by the voltage-controlled oscillator. The phase detector PD comprises two output lines: UP and DOWN, the first output line DOWN being used for controlling the charging current source CS1 of the charge pump CHP, and the second output line UP being used for controlling the discharging current source CS2. In a situation in which the frequency of the reference signal is greater than the frequency of the clock signal generated by the voltage-controlled oscillator VCO, or the phase of the reference signal leads the signal generated by the voltage-controlled oscillator VCO, the phase detector generates a pulse in the UP line, wherein a second switch SW2 in the charge pump is turned off. Thus, the charging current source CS1 is allowed to supply current to the output of the charge pump. This current $i_{source}$ from the charging current source CS1 is supplied to the loop filter LF to increase the charge of a capacitor therein. This increase in the charge of the capacitor causes an increase in the voltage at the input of the voltage-controlled oscillator VCO. Consequently, the frequency of the clock signal generated by the voltage-controlled oscillator is increased. Correspondingly, in a situation where the frequency of the reference signal is smaller than the frequency of the clock signal generated by the voltage-controlled oscillator VCO, or the phase of the reference signal lags the signal generated by the voltage-controlled oscillator VCO, the phase detector generates a pulse in its first output, i.e. the output line DOWN, wherein a first switch SW1 in the charge pump is turned off. Thus, the discharging current source CS2 is allowed to drain current from the output of the charge pump, wherein the charge of the capacitor of the loop filter is discharged by the current $i_{sink}$ of this discharging current source. This reduction in the current is manifested as a reduction in the voltage at the input of the voltage-controlled oscillator. Thus, the frequency of the clock signal generated by the voltage-controlled oscillator VCO is reduced.

The above description applies to a charge pump structure in which the switches SW1, SW2 are normally closed. It is also possible for the switches SW1, SW2 to be in a normally open condition. In that case the operation of the switches SW1, SW2 is slightly different. The UP line being used for controlling switch SW1 and the DOWN line being used for controlling switch SW2. In a situation in which the frequency of the reference signal is greater than the frequency of the clock signal generated by the voltage-controlled oscillator VCO, or the phase of the reference signal leads the signal generated by the voltage-controlled oscillator VCO, the phase detector generates a pulse in the UP line, wherein a first switch SW1 in the charge pump is turned on and the second switch SW2 remains open. Correspondingly, in a situation where the frequency of the reference signal is smaller than the frequency of the clock signal generated by the voltage-controlled oscillator VCO, or the phase of the reference signal lags the signal generated by the voltage-controlled oscillator VCO, the phase detector generates a pulse in its first output, i.e. the output line DOWN, wherein a second switch SW2 in the charge pump is turned on and the first switch SW1 remains open.

It is also possible to operate the voltage-controlled oscillator VCO to operate in the opposite way—i.e. a decrease in voltage produces an increase in frequency and vice versa.

In a situation in which the reference signal and the signal generated by the voltage-controlled oscillator have the same frequency and the same phase, i.e. the phase-locked loop is in locked condition, there is no pulse in the phase detector outputs UP and DOWN. Thus, the current sources CS1, CS2 of the charge pump are either switched off or both current sources CS1, CS2 of the charge pump are connected to the output of the charge pump. Ideally charging current $i_{source}$ and discharging current $i_{sink}$ are designed to be the same. In an ideal situation, there should thus be no current in the output of the charge pump, and the charge of the capacitor of the loop filter should remain constant and also the frequency of the clock signal generated by the voltage-controlled oscillator VCO should remain substantially constant. In practical applications, however, the structures of the current sources CS1, CS2 of the charge pump cannot be made fully identical, e.g. for the reason that the charging current source CS1 is implemented by using a transistor of the P type or a P channel transistor, and the discharging current source CS2 is implemented with a transistor of the N type or an N channel transistor, which cannot be made identical in practice. This results in a current mismatch of typically in the order of 5 to 20% in the currents $i_{source}$, $i_{sink}$ of the current sources. As an example of such a known phase-locked loop, the integrated circuit LMX2335 by National Semiconductor company can be mentioned, in which the structures of the current sources are aimed at being made as identical as possible. However, also in this circuit, the current mismatch is of the order presented above.

In a situation where the phase-locked loop is in the locked condition and both current sources CS1, CS2 are connected to the output of the charge pump CHP, the current mismatch leads to the capacitor of the loop filter LF being discharged or charged, depending on which current source CS1, CS2 generates a current with a greater absolute value. This results in a change in the frequency of the clock signal generated by the voltage-controlled oscillator VCO. This change causes a need for correcting the phase-locked loop PLL. Thus, the frequency generated by the phase-locked loop is not constant, but it has slight variations which are manifested as an interfering signal on the other stages of the wireless communication device.

The difference in the currents $i_{source}$, $i_{sink}$ generated by the current sources CS1 and CS2 is also manifested in that the frequency of the clock signal generated by the voltage-controlled oscillator VCO increases faster, if the current $i_{source}$ supplied by the charging current source CS1 is greater, or decreases faster, if the current $i_{sink}$ drained by the discharging current source CS2 is greater. As a result, the length of the pulses in the outputs UP and DOWN of the phase detector are not the same. This, in turn, causes interfering frequencies in the output of the phase-locked loop PLL and other spurious signals. One possibility to reduce this interference is to reduce the bandwidth of the loop filter, but this will slow down the operation of the phase-locked loop. Particularly in the next generation mobile communication systems, which are currently under development, such as the general packet radio service (GPRS), high requirements are set for the rate of frequency synthesis in the receiving and transmitting channel, because of an increasing need for channel switching during wireless communication.

It is an aim of the present invention to provide a method for reducing the unwanted effects caused by the non-ideal properties of a charge pump, as well as a charge pump structure in which the effects caused by the non-ideal properties of the charge pump are eliminated to a major extent. The invention is based on the idea of providing a second charge pump which is identical with the first charge pump and in which deviations caused by non-ideal properties are used to compensate for the effect of non-ideal properties of the first charge pump. The method according to the present invention is characterized in what is presented in the characterizing part of the appended claim 1. The charge pump structure of the present invention is characterized in what will be presented in the characterizing part of the appended claim 5. Furthermore, a wireless communication device according to the present invention is characterized in what will be presented in the characterizing part of the appended claim 10.

The present invention gives significant advantages in comparison with the solutions of prior art. To implement two substantially identical charge pumps is considerably easier than to balance the charging and discharging current sources of a charge pump. Particularly, in connection with the manufacture of integrated circuits, it is easy to copy a charge pump by geometrical copying of the charge pump section. Thus, the properties of both charge pumps are very similar to each other. In the charge pump structure of the invention, the second charge pump is used for providing reference information to the first charge pump. This reference information, which is advantageously information about the mismatch current, is used for correcting the output current generated by the first charge pump. The charge pump structure of the invention can also be advantageously implemented with separate components, wherein the mutual balancing of the current generators (source and sink) in each charge pump is not critical. Instead, it is easier to select the corresponding components in the charge pumps to have substantially identical properties, wherein the reference information corresponds to the non-ideal properties of the first charge pump as well as possible. The frequency synthesis implemented with the charge pump structure of the invention is considerably less prone to interference and does not contain such a high proportion to spurious frequencies as occur in solutions of prior art. Moreover, the frequency formed in the frequency synthesis does not fluctuate as strongly as in frequency synthesis using a phase-locked loop of prior art.

In the following, the invention will be described in more detail with reference to the appended drawings, in which.

Figure 3A:
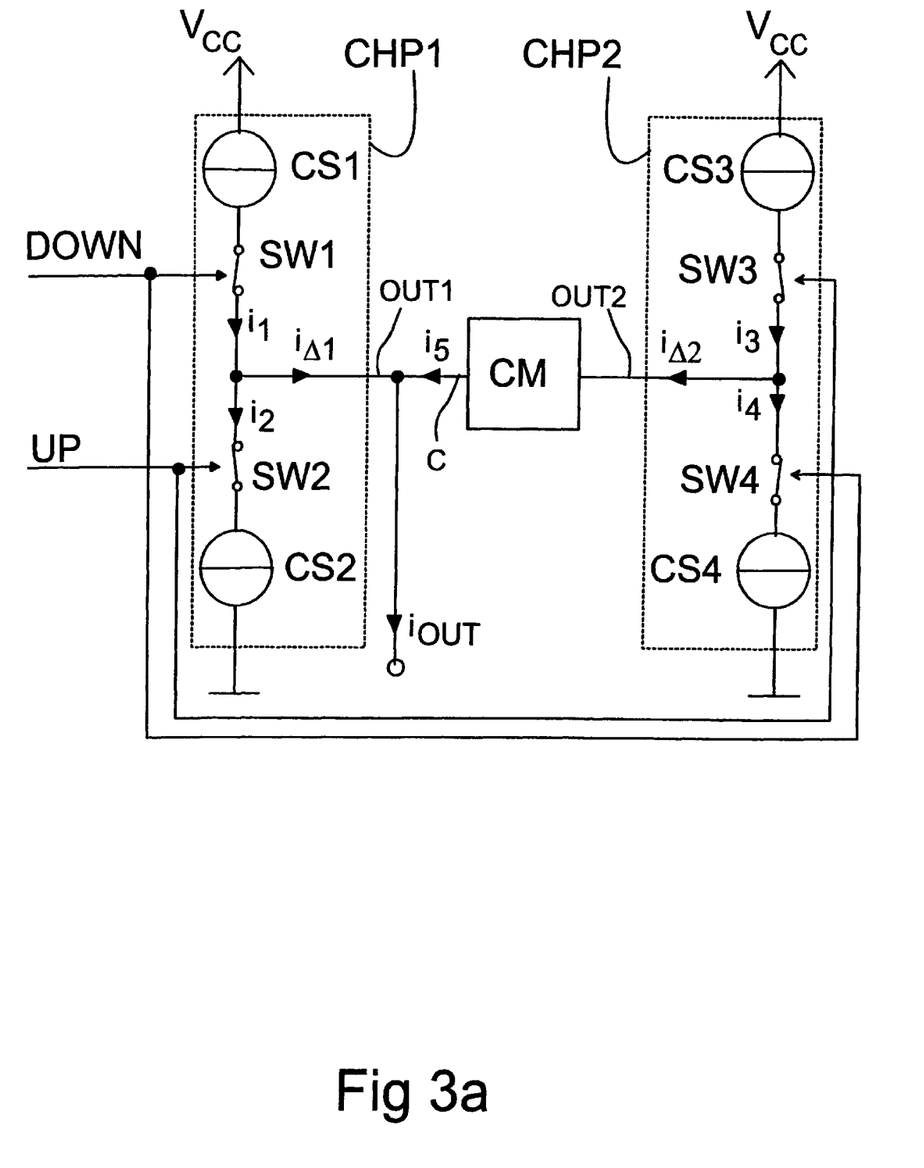
FIG. 3a shows a charge pump structure according to an advantageous embodiment of the invention, in a reduced block chart.
Figure 4:
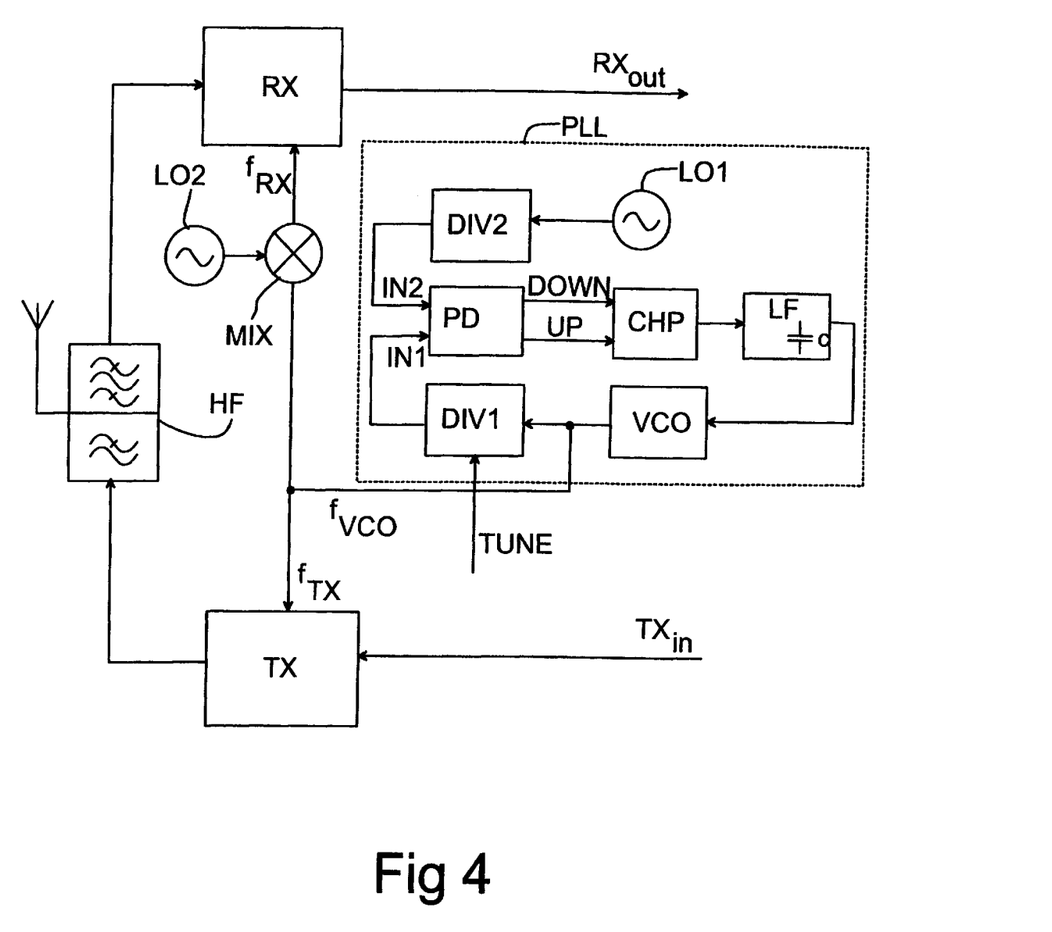
FIG. 4 shows a transmitter-receiver structure, in which the invention can be advantageously applied.

FIG. 3a shows, in a reduced block chart, a charge pump structure according to an advantageous embodiment of the invention. It comprises two charge pumps CHP1, CHP2. Further, the charge pump structure comprises means CM for copying the reference information generated by the second charge pump CHP2 to the output of the first charge pump CHP1. The first charge pump CHP1 comprises two current sources CS1, CS2 as well as two switch means SW1, SW2. The charging current source CS1 is implemented e.g. with a transistor of the P type, as already disclosed above in this specification. In a corresponding manner, the discharging current source CS2 is implemented e.g. with a transistor of the N type. The aim is to select or fabricate the components of the current charges CS1, CS2 so that the current strengths $i_{source1}$, $i_{sink1}$ are substantially the same. In practice, it is possible to achieve the accuracy of a few per cent. The charging current source CS1 is coupled, at one end, e.g. to an operating voltage source $V_{CC}$ and, at the other end, to the first switch means SW1. The discharging current source is coupled, at one end, advantageously to the ground potential and, at the other end, to the second switch means SW2. These switch means SW1, SW2 are controlled in the phase-locked loop application by signals generated by the phase detector PD (FIG. 4). The switch means SW1, SW2 are advantageously solid state switches or other electrically controllable switch solutions known as such. It is obvious that the switch means SW1, SW2 can also be implemented in another way, known as such, so that the current strength supplied by the respective current source CS1, CS2 in the output of the charge pump CHP1 is substantially zero.

With respect to the current sources CS1, CS2, the second charge pump CHP2 is implemented in such a way that it is as identical to the first charge pump CHP1 as possible. Thus, the charging current source of the second charge pump, which is indicated with the reference numeral CS3, is implemented in such a manner that it is as identical to the current source CS1 of the first charge pump as possible. Also, the discharging current source CS4 of the second charge pump is implemented in such a manner that it is as identical to the discharging current source CS2 of the first charge pump as possible. Thus, the current strengths supplied by the first charging current source CS1 and the second charging current source CS3 (indicated as $i_1$ and $i_3$ in FIG. 3a) are substantially identical. Also the current strengths drained by the first discharging current source CS2 and the second discharging current source CS4 (indicated as $i_2$ and $i_4$ in FIG. 3a) are substantially identical to each other.

In the following, the operation of a charge pump structure according to an advantageous embodiment of the invention will be described, with reference to FIG. 3a. It is assumed that the switch means SW1, SW2 are first closed. Thus, the current $i_1$ supplied by the first charging current source CS1 passes through the first switch means SW1 to the output OUT1 of the first charge pump. The first discharging current source CS2 drains a current strength $i_2$ from the output OUT1 via the second switch means SW2 to ground. Thus, the first charging current source CS1 and the first discharging current source CS2 generate a leakage current $i_{A1}$ at the output OUT1 of the first charge pump. According to Kirchhoff's current law, the algebraic sum of currents toward any point in a network is zero. In the markings of FIG. 3a, the direction arrows of currents represent the direction of a positive current, wherein when the current strength is less than 0, the direction of the current is opposite to that indicated in the figure, which is known as such. Thus, the quantity of the leakage current $i_{A1}$ is the difference between the current drained by the first discharging current source CS2 and the current supplied by the first charging current source CS1, and is represented by the formula:

$$i_{A1}=i_1-i_2 \qquad \text{(Formula 1)}$$

The operation of the second charge pump CHP2 is substantially identical to the operation of the first charge pump CHP1. In this advantageous embodiment of the invention the switch means SW1 and SW4 are both controlled simultaneously so that when the switch means SW1 is closed, the switch means SW4 is closed, too and vice versa. Also the switch means SW2 and SW3 are both controlled simultaneously so that when the switch means SW2 is closed, the switch means SW3 is closed, too and vice versa. In a situation where the switch means SW3, SW4 are closed, the current $i_3$ supplied by the second charging current source CS3 passes through the switch means SW3 to the output OUT2 of the second charge pump. The second discharging current source CS4 drains a current strength $i_4$ from the output OUT2 via the fourth switch means SW4 to ground. Consequently, the second charge pump CHP2 generates a reference current strength $i_{A2}$ at its output OUT2. The quantity of this reference current can be calculated, according to the markings of FIG. 3a, by the formula:

$$i_{A2}=i_3-i_4 \qquad \text{(Formula 2)}$$

Figure 3B:
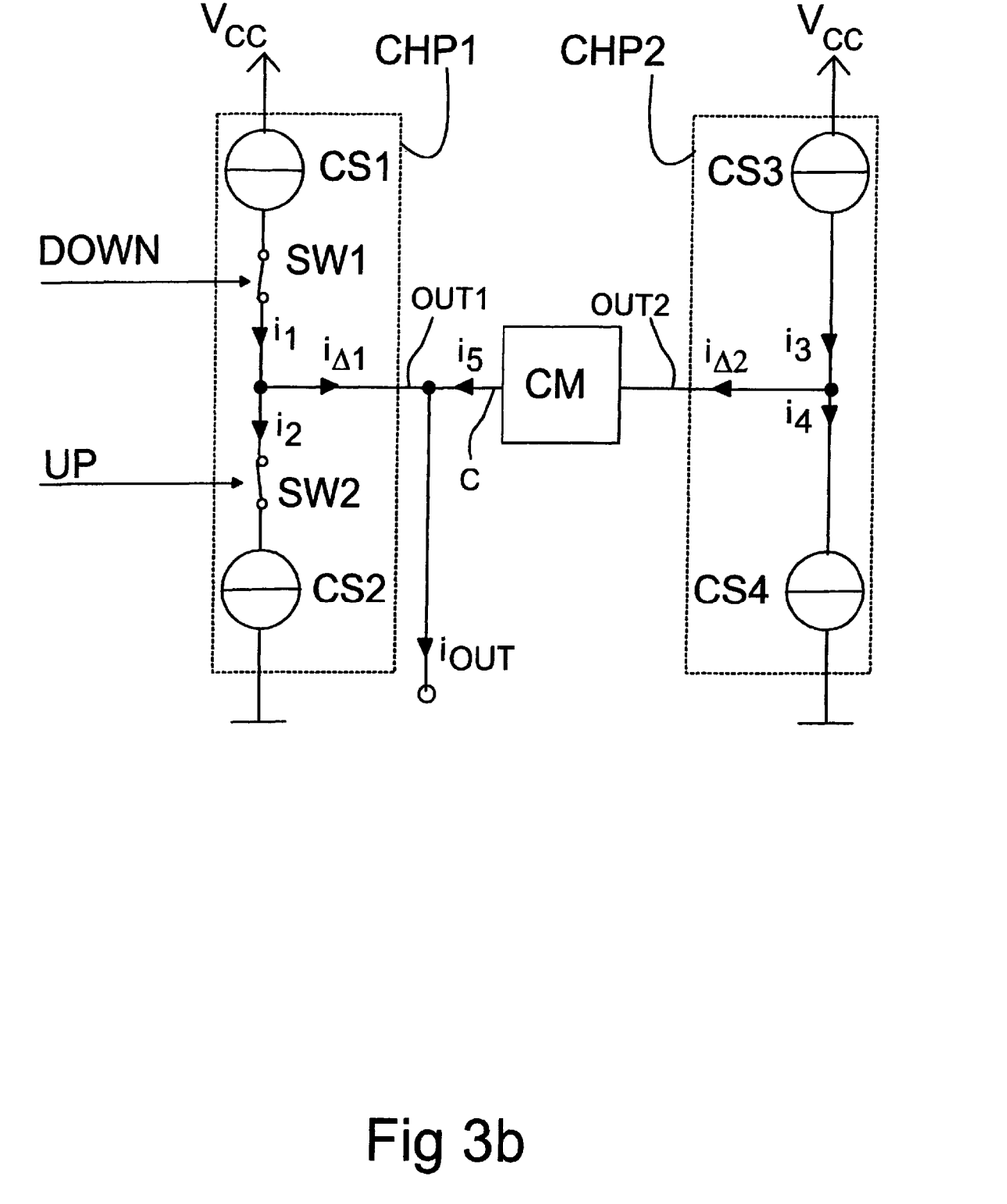
FIG. 3b shows a charge pump structure according to another advantageous embodiment of the invention, in a reduced block chart.

Now, referring to the markings of FIGS. 3a and 3b, especially to the arrows, which represent (positive) directions of the currents of the charge pump structure, the means CM for copying are arranged to generate a current $i_5$ whose strenght is proportional by a factor k to the reference current $i_{A2}$ and the direction is reversed. The reference current $i_{A2}$ is conveyed to means CM for copying which generates, in its output line C, a current whose strength is proportional, preferably directly proportional, to the reference current $i_{A2}$ supplied by the second charge pump CHP2, i.e. the amplification of the means CM for copying in this advantageous embodiment is ca. 1. This means that the factor k is approximately 1. The amplification of the means CM for copying can also be variable or tunable. This variability/tunability can be extended to other blocks of the charge pump structure. For example, the current ratio between the currents generated by the first charging current source CS1 and the second charging current source CS3 and respectively the current ratio between the currents generated by the first discharging current source CS2 and the second discharging current source CS4 can be greater than one or less than one. The means CM for copying is for example a current mirror or any current conveyor structure, any current or voltage sampler or the like. The current $i_5$ supplied by the means CM for copying is conveyed to the output OUT1 of the first charge pump. Thus, the output current (indicated $i_{OUT}$) of the charge pump structure of FIG. 3a is the difference between the leakage current $i_{A1}$ and the current $i_5$ supplied by the means CM for copying. Consequently, the output current $i_{OUT}$ can be calculated using the formula:

$$i_{OUT}=i_5+i_{A1} \qquad \text{(Formula 3)}$$

By replacing in the formula 3 the current supplied by the copying means $i_5=-k*i_{A2}$, the output current obtained is $$i_{OUT}=i_{A1}-k*i_{A2} \qquad \text{(Formula 4)}$$

By substituting formulae 1 and 2 in to formula 4, the equation obtained for the output current $i_{OUT}$ is (k=1):

$$i_{OUT}=(i_1-i_2)-(i_3-i_4)=i_1-i_2-i_3+i_4 \qquad \text{(Formula 5)}$$

In the situation presented above, the output current $i_{OUT}$ is very close to zero, due to the substantially identical nature of charge pumps CHP1, CHP2.

In a situation where the first switch means SW1 is open ($i_1 \approx 0$), the output current $i_{OUT}$ of the charge pump structure is influenced by the current strength $i_2$ drained by the first discharging current source CS2 as well as by the reference current $i_{A2}$ supplied by the second charge pump CHP2. Because in this situation also the fourth switch means SW4 is open ($i_4 \approx 0$), the output current $i_{A2}$ of the second charge pump is the current $i_3$ supplied by the second charging means CS3. This is conveyed to the means CM for copying, wherein according to Formula 5, the output current $i_{OUT}$ obtained for the charge pump structure is minus the sum of the current strength of the first discharging current source CS2 and the current strength of the second charging current source CS3, i.e. $-(i_2+i_3)$. On the other hand, the strength of the current $i_3$ supplied by the second charging current source CS3 is substantially equal to the strength of the current supplied by the first charging current source CS1, wherein the output current of the charge pump can be presented also in the form $$i_{OUT}=-(i_1+i_2) \qquad \text{(Formula 6a)}$$

i.e. as minus the sum of the currents drained by the first discharging current source CS2 and the first charging current source CS1.

Correspondingly, in a situation where the first switch means SW1 is closed and the second switch means SW2 is open ($i_2 \approx 0$), wherein also the third switch means SW3 is open ($i_3 \approx 0$) and the fourth switch means SW4 is closed, the output current $i_{OUT}$ of the charge pump structure can be calculated by following the principles presented above. Thus, the output current obtained is the sum of the current strength $i_1$ supplied by the first charging current source CS1 and the current strength $i_4$ drained by the second discharging current source CS4. Since the strength of the current $i_4$ drained by the second discharging current source CS4 is substantially identical to the strength of the current $i_2$ drained by the first discharging current source CS2, the output current $i_{OUT}$ of the charge pump structure in this situation can be presented as the sum of the currents $i_1$, $i_2$ supplied by the current sources CS1, CS2 of the first charge pump.

$$i_{out}=i_1+i_2 \qquad \text{(Formula 6b)}$$

From the description above, it can be stated that in the charge pump structure according to the invention, the differences in the strengths of the currents supplied by the charging CS1, CS3 and drained by discharging current sources CS2, CS4 are not significant as such. Also the absolute directions of the currents $i_1-i_4$, $i_{A1}$, $i_{A2}$, $i_{OUT}$ in practical implementations need not be the same as presented in the figures. They are presented as an example, only. What is relevant is that the ratio of the currents $i_1$, $i_3$ supplied by the charging current sources CS1, CS3 is substantially equal to the ratio of the currents $i_2$, $i_4$ drained by the discharging current sources CS2, CS4, i.e. the absolute strength of the currents in the second charge pump CHP2 could be some constant multiplied by the strength of the current in the first charge pump CHP1. As was mentioned above the ratio of the currents $i_1$, $i_3$; $i_2$, $i_4$ in an advantageous embodiment is ca. 1. The factor k prefarably equals the ratio $i_1/i_3$ (or $i_2/i_4$).

FIG. 3b shows, in a reduced block chart, a charge pump structure according to another advantageous embodiment of the invention. It also comprises two charge pumps CHP1, CHP2. Further, the charge pump structure comprises means CM for copying the reference information generated by the second charge pump CHP2 to the output of the first charge pump CHP1. The first charge pump CHP1 comprises two current sources CS1, CS2 as well as two switch means SW1, SW2.

The second charge pump CHP2 is implemented in such a way that it has the current sources CS3, CS4 as identical to the current sources CS1, CS2 of the first charge pump CHP1 as possible. The current $i_3$ supplied by the second charging current source CS3 is allowed to flow continuously to the output OUT2 of the second charge pump CHP2. Also the second discharging current source CS4 is allowed to drain current $i_4$ continuously from the output OUT2 of the second charge pump CHP2. Therefore the switch means SW3, SW4 can be replaced by wires or the like. The reference current $i_{A2}$ generated by the second charge pump CHP2 at its output OUT2 is continuously injected by the means CM for copying into the output OUT1 of the first charge pump CHP1 to compensate the mismatch between the current $i_1$ supplied by the first current source CS1 and the current $i_2$ drained by the first discharging current source CS2.

Figure 5A:
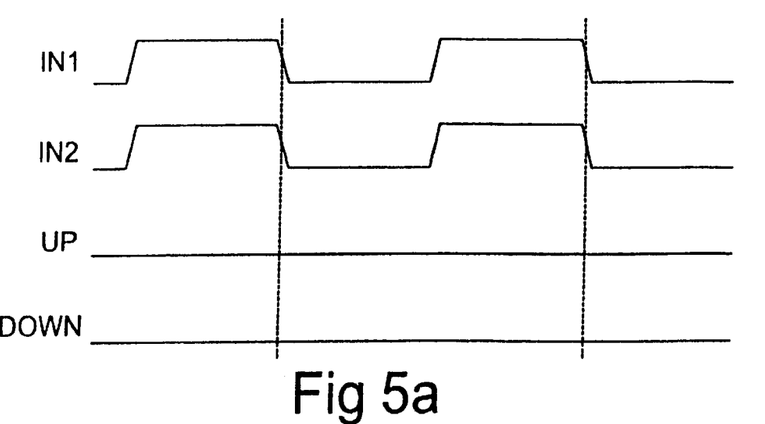
FIGS. 5a–5c shows as timing charts on the operation of a phase comparator.
Figure 5B:
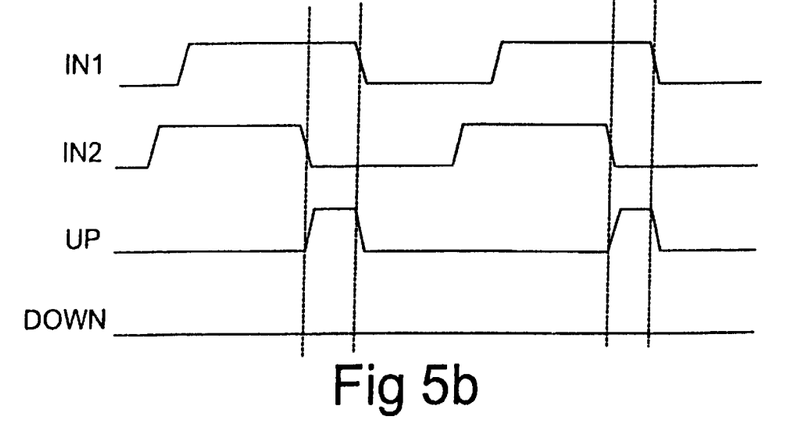
Figure 5C:
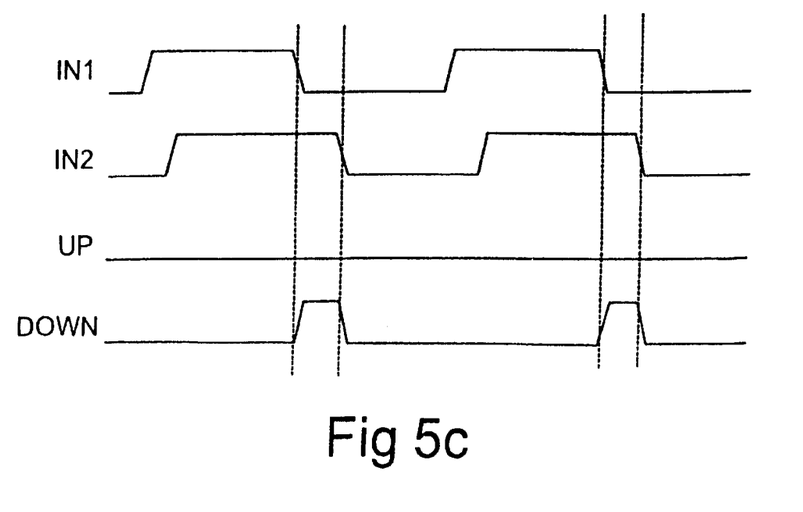

Furthermore, the following is a description of the operation of the charge pump structure according to the invention in a high-frequency block of a wireless communication device such as that shown in FIG. 4, with reference to the timing charts of FIGS. 5a–5c. FIG. 4 shows only some functional features of the high-frequency block. The high-frequency block consists of a receiver block RX, a transmitter block TX, a reference oscillator LO1, as well as a phase-locked loop PLL. For practical reasons, the frequency of the reference oscillator LO1 is lower than local oscillator frequencies $f_{RX}$, $f_{TX}$ required by the receiver block RX and the transmitter block TX. In the phase-locked loop PLL, this is taken into account e.g. so that the signal generated by the voltage-controlled oscillator VCO is conveyed to a first frequency divider DIV1 in which a desired divider value can be set with a control line TUNE. Thus, the output of the first divider DIV1 contains the frequency generated by the voltage-controlled oscillator VCO divided by the set divider value. In the embodiment of FIG. 4, the frequency of the signal generated by the reference oscillator LO1 is also divided in a second divider DIV2 before conveying it to the phase detector PD. The frequency of the reference oscillator LO1 as well as the divider values of the first divider DIV1 and the second divider DIV2 are selected so that when the voltage-controlled oscillator VCO is tuned to a desired frequency, the signals in the input lines of the phase detector PD have substantially the same frequency and the same phase. The frequency generated by the voltage-controlled oscillator VCO is used as a local oscillator frequency $f_{TX}$ for the transmitter block TX. The local oscillator frequency for the receiver block RX is generated by mixing in the mixer MIX the frequency generated by the voltage-controlled oscillator VCO and the frequency generated by the duplex oscillator LO2, which is known as such. Another alternative is that the local oscillator frequency for the transmitter block TX is generated by mixing in the mixer MIX the frequency generated by the voltage-controlled oscillator VCO and the frequency generated by the duplex oscillator LO2 and the frequency generated by the voltage-controlled oscillator VCO is used as a local oscillator frequency $f_{RX}$ for the receiver block RX. The duplex oscillator LO2 can also be omitted in some implementations.

A high frequency signal is received by the antenna and band bass filtered in the high frequency filter block HF so that the correct high frequency signals are sent to the receiver block RX. The high frequency signals are converted to intermediate frequencies or into base band frequencies and demodulated in the receiver block RX.

The signals to be transmitted are modulated and converted to high frequency signals in the transmitter block TX. The modulated, high frequency signal is low pass filtered in the high frequency filter block HF and transmitted via the antenna.

The phase detector PD comprises two outputs: UP and DOWN. The outputs UP, DOWN of the phase detector are used to control the operation of the charge pump according to the invention advantageously in the following way: When the phase-locked loop PLL is in locked condition, the outputs UP, DOWN of the phase detector PD are e.g. in the logical 0 state. In this advantageous example, this means that the switch means SW1–SW4 of the charge pumps CHP1, CHP2 are closed. As stated above in the description of the example of FIG. 3a, the current strength in the output of the charge pump structure CHP is substantially zero, wherein the charge of the capacitor of the loop filter LF is not changed significantly. This also keeps the frequency of the voltage-controlled oscillator VCO substantially unchanged. The timing chart corresponding to this situation is presented in FIG. 5a. It shows the output signal of the dividers DIV1, DIV2 for two cycles as well as the state of the outputs UP, DOWN of the phase detector PD.

In a situation in which e.g. the channel is changed, a new divider value is set in the first divider DIV1. If the channel change requires an increase in the frequency, the divider value is increased, wherein the frequency of the signal in the first input IN1 is lower than the frequency of the signal in the second input IN2. Apparently there exists a phase difference between the phase of the signal in the first input IN1 of the phase detector PD and the phase of the signal in the second input IN2. Thus, the phase detector PD generates pulses in the first output UP, until the input signals of the phase detector PD are substantially in the same frequency and phase. This situation is presented in the timing chart of FIG. 5b. These pulses make the switch means SW2 and SW3 of the charge pump CHP open for the time of the pulses. Thus, during each pulse, the output of the charge pump CHP has a current strength which causes charging of the capacitor in the loop filter, wherein the output voltage of the loop filter LF is increased. This will result in an increase in the frequency of the voltage-controlled oscillator. When the frequency of the voltage-controlled oscillator VCO corresponds to the set channel frequency, the phase-locked loop PLL is thus locked and the switch means SW1–SW4 of the charge pump CHP are closed.

In a corresponding manner, in a situation where the frequency of the voltage-controlled oscillator VCO is to be reduced, the divider value of the first divider is decreased, wherein the frequency of the signal in the first input IN1 is greater than the frequency of the signal in the second input IN2. Apparently there exists a phase difference between the phase of the signal in the first input IN1 of the phase detector PD and the phase of the signal in the second input IN2. Thus, the phase detector PD generates pulses in the second output DOWN, until the input signals of the phase detector PD are substantially in the same frequency and phase. This situation is presented in the timing chart of FIG. 5c. These pulses make the switch means SW1 and SW4 in the charge pump CHP open for the time of the pulses. Thus, during each pulse, the output of the charge pump CHP contains a current strength which causes discharging of the capacitor of the loop filter, wherein the output voltage of the loop filter LF decreases. This results in a reduction in the frequency of the voltage-controlled oscillator VCO, until the frequency of the voltage-controlled oscillator VCO corresponds to the set frequency.

The description above assumes that an increase in voltage produces an increase in frequency. As was mentioned earlier in the description, the voltage controlled oscillator may also operate in the opposite way, wherein the operation of the phase-locked loop PLL should be modified accordingly, which is known as such.

With the charge pump structure of the invention, the above-presented changes in the frequency take place at a substantially equal rate, irrespective of the direction of the change in the frequency. However, in the solutions of prior art, the charging and discharging current strengths are not equal because in practical applications the structures of the current sources CS1, CS2 of the charge pump cannot be made fully identical. This results in a current mismatch, wherein the change rate is affected also by the direction of the change.

The high-frequency block of FIG. 4 can be applied for example in wireless communication devices, base transceiver stations, satellite stations, etc.

In the charge pump structure according to the invention, the first charge pump CHP1 is in the signal path; i.e., the output signals of the phase detector PD are conveyed to the first charge pump CHP1, as in the solutions of prior art, but the second charge pump is separated from the signal path.

It is obvious that the invention can also be applied in a way that when the phase-locked loop PLL is in locked condition, the switch means SW1–SW4 of the charge pump CHP are open, which means in practice that there is substantially no current in the output of the charge pump CHP.

A simulation was conducted on a charge pump structure of the invention, using the following test values: First charge pump CHP1: charging current $i_1$=1.001 mA and discharging current $i_2$=988.8 µA; matching accuracy of charge pumps 2% which means a maximum error of 20 µA at a current of 1 mA. The simulation results indicated that in the charge pump structure of the invention, the output current was clearly less than 1 µA in a situation where all the current sources were connected.

The charge pump structure of the invention can also be applied in other connections than in phase-locked loops. The present invention is not limited only to the embodiments presented above, but it can be modified within the scope of the appended claims.

What is claimed is:

1. A method for balancing the output current ($i_{A1}$) of a first charge pump (CHP1), the first charge pump (CHP1) comprising a first charging current source (CS1) and a first discharging current source (CS2), and in which method the output current ($i_{A1}$) of the first charge pump (CHP1) is supplied by at least one said current source (CS1, CS2), characterized in that the method consists of the following steps:

providing a second charge pump (CHP2) with a second charging current source (CS3) and a second discharging current source (CS4), supplying the output current ($i_{A2}$) of said second charge pump (CHP2) by at least one said second current source (CS3, CS4), and supplying a reference current ($i_5$) on the basis of the output current ($i_{A2}$) supplied by said second charge pump (CHP2), wherein the balancing is conducted by combining said reference current ($i_5$) with the output current ($i_{A1}$) supplied by the first charge pump (CHP1).

2. A method according to claim 1, characterized in that the second charge pump (CHP2) is formed substantially identical to the first charge pump (CHP1).

3. A method according to claim 1, characterized in that when supplying the output current ($i_{A1}$) of the first charge pump (CHP1) by the first charging current source (CS1), the second discharging current source (CS4) is used for forming the reference current ($i_5$), or when supplying the output current ($i_{A1}$) of the first charge pump (CHP1) by the first discharging current source (CS2), the second charging current source (CS3) is used for forming the reference current ($i_5$), or when supplying the output current ($i_{A1}$) of the first charge pump (CHP1) by both the first charging current source (CS1) and the first discharging current source (CS2), both the second discharging current source (CS4) and the second charging current source (CS3) are used for forming the reference current ($i_5$).

4. A method according to claim 1, characterized in that both the second discharging current source (CS4) and the second charging current source (CS3) are continuously used for forming the reference current ($i_5$).

5. A charge pump structure, which comprises at least a first charge pump (CHP1) comprising a first charging current source (CS1) and a first discharging current source (CS2), and means (SW1, SW2) for supplying the output current ($i_{A1}$) of the first charge pump (CHP1) by at least one said current source (CS1, CS2), characterized in that the charge pump structure (CHP) further comprises:

a second charge pump (CHP2) with a second charging current source (CS3) and a second discharging current source (CS4), means (SW3, SW4) for supplying the output current ($i_{A2}$) of said second charge pump (CHP2) by at least one said second current source (CS3, CS4), means (CM) for supplying a reference current ($i_5$) on the basis of the output current ($i_{A2}$) supplied by said second charge pump (CHP2), and means for combining said reference current ($i_5$) with the output current ($i_{A1}$) supplied by the first charge pump (CHP1).

6. A charge pump structure according to claim 5, characterized in that the second charge pump (CHP2) is formed substantially identical to the first charge pump (CHP1).

7. A charge pump structure according to claim 5, characterized in that means for supplying the output current ($i_{A2}$) of said second charge pump (CHP2) comprises:

means for supplying the output current ($i_{A2}$) of said second charge pump (CHP2) by the second discharging current source (CS4) when supplying the output current ($i_{A1}$) of the first charge pump (CHP1) by the first charging current source (CS1), and means for supplying the output current ($i_{A2}$) of said second charge pump (CHP2) by the second charging current source (CS3) when supplying the output current ($i_{A1}$) of the first charge pump (CHP1) by the first discharging current source (CS2).

8. A charge pump structure according to claim 5, characterized in that means (CM) for supplying a reference current ($i_5$) comprises a current mirror, any current conveyor structure, any current or voltage sampler or the like.

9. A charge pump structure according to claim 5, characterized in that means for supplying the output current ($i_{A2}$) of said second charge pump (CHP2) comprises means for continuously supplying the output current ($i_{A2}$) of said second charge pump (CHP2) by the second charging current source (CS3) and by the second discharging current source (CS4).

10. A wireless communication device, which comprises at least a first charge pump (CHP1) comprising a first charging current source (CS1) and a first discharging current source (CS2), and means (SW1, SW2) for supplying the output current ($i_{A1}$) of the first charge pump (CHP1) by at least one said current source (CS1, CS2), characterized in that the wireless communication device further comprises:

a second charge pump (CHP2) with a second charging current source (CS3) and a second discharging current source (CS4), means (SW3, SW4) for supplying the output current ($i_{A2}$) of said second charge pump (CHP2) by at least one said second current source (CS3, CS4), means (CM) for supplying a reference current ($i_5$) on the basis of the output current ($i_{A2}$) supplied by said second charge pump (CHP2), and means for combining said reference current ($i_5$) with the output current ($i_{A1}$) supplied by the first charge pump (CHP1).

11. A wireless communication device according to claim 10, characterized in that it is a mobile station.

12. A wireless communication device according to claim 10, characterized in that it is a base transceiver station.

* * * * *